United States Patent [19]

Gabara

[11] Patent Number: 4,823,029

[45] Date of Patent: Apr. 18, 1989

[54] NOISE CONTROLLED OUTPUT BUFFER

[75] Inventor: Thaddeus J. Gabara, North Whitehall Township, Lehigh County, Pa.

[73] Assignee: American Telephone and Telegraph Company AT&T Bell Laboratories, Murray Hill, N.J.

[21] Appl. No.: 66,902

[22] Filed: Jun. 25, 1987

[51] Int. Cl.[4] .................... H03K 17/16; H03K 17/284; H03K 17/687; H03K 19/003

[52] U.S. Cl. .................................... 307/443; 307/473; 307/270; 307/296.1; 307/542

[58] Field of Search ............... 307/442, 443, 473, 270, 307/296 R, 578, 454, 456, 542; 365/226, 228

[56] References Cited

U.S. PATENT DOCUMENTS

| | | | |
|---|---|---|---|
| 4,346,343 | 8/1982 | Berndlmaier et al. | 323/282 |
| 4,425,517 | 1/1984 | Smith | 307/473 |
| 4,567,378 | 1/1986 | Raver | 307/270 |
| 4,585,958 | 4/1986 | Chung et al. | 307/473 |
| 4,593,206 | 6/1986 | Neidorff et al. | 307/270 |
| 4,620,310 | 10/1986 | Lvovsky et al. | 307/473 X |
| 4,621,208 | 11/1986 | Van Tran | 307/473 |
| 4,721,866 | 1/1988 | Chi et al. | 307/270 X |
| 4,723,108 | 2/1988 | Murphy et al. | 323/312 |

OTHER PUBLICATIONS

IBM J. Res. Develop, vol. 25, No. 3, May 1981, "Delay Regulation-A Circuit Solution to the Power/Performance Tradeoff", E. Berndlmaier, J. A. Dorler, J. M. Mosley, S. D. Weitzel, pp. 135 through 141.

*Primary Examiner*—Stanley D. Miller
*Assistant Examiner*—David R. Bertelson
*Attorney, Agent, or Firm*—James H. Fox

[57] ABSTRACT

An integrated circuit has output buffers whose switching rise and/or fall times are controlled to compensate for process speed and other variations. Therefore, an integrated circuit fabricated by a "fast" process does not generate excessive noise, while integrated circuits fabricated by a "slow" process still obtain adequate speed. A control voltage generated by an on-chip voltage divider network is applied to the gate of a control transistor to provide the compensation.

6 Claims, 3 Drawing Sheets

VDD
MP11
ST
MP12
MP16
MN15
ST
MN14
VCN
MN13
VSS
IN
VDD
OUT
VCP
MP13
ST
MP14
MP15
MN16
ST
MN12
MN11
VSS
VDD
MP43
MP41
MP44
R41
MN41
VSS
VCN
VDD
MP42
MN44
R42
MN43
MN42
VSS
VDD
MP51
MP53
R51
MP54
MN51
VSS
VDD
VCP
MP52
R52
MN54
MN52
MN53
VSS

OUT
IN
MP66
MN66
MP61
MP62
MN61
MN62
MN64
MN65
MN63
MP63
MP65
MP64
ST
VCN
VCP
VDD
VSS

VCP
MP53
MP54
MN54
MN53
MP51
R51
MN51
MP52
R52
MN52
VDD
VSS

NOISE CONTROLLED OUTPUT BUFFER

BACKGROUND OF THE INVENTION

1. Field of the Invention

The present invention relates to reducing the noise generated by integrated circuit output buffers during switching.

2. Description of the Prior Art

An integrated circuit (IC) typically communicates to external devices through electrical conductors driven by output buffers. A buffer is a circuit designed to provide adequate current drive capability to charge up the capacitive load presented by the external conductors at a sufficiently fast rate to allow signals to be sent at the desired speed. The speed at which a buffer can raise a voltage from a low logic level (e.g., near 0 volts) to a high logic level (e.g., near 5 volts) is referred to as the "rise time". Similarly, the speed at which the buffer can reduce the voltage from high to low levels is the "fall time". With CMOS integrated circuits, the speed of data communications to external devices presently ranges up to several tens of million bits per second, with increases to over one hundred million bits per second likely in the near future. Therefore, the rise and fall times are typically required to be less than about 10 nanoseconds at present, with significant reductions required for the future.

One problem associated with signals having rapid rise and fall times is the electrical noise they produce in others parts of the integrated circuit. That is, stray capacitance and inductance cause some of the signal energy to couple to other portions of the integrated circuit, or to other conductors external to the IC. In addition, inductance in the ground path causes voltage spikes to appear due to rapid current variations caused by the output buffers. These problems generally become more severe as the rise and fall times become shorter. In most cases, integrated circuit output buffers are designed so that the rise and fall times are sufficiently fast to drive the load under worst case conditions. For CMOS integrated circuits, the worst case conditions are slower than nominal process speeds, low power supply voltages (e.g., about 4.75 volts for a nominal 5 volt supply), and high operating temperatures. However, under the best case conditions, the rise and fall times may then be so short as to generated excessive noise. The "process speed" refers to the fact that due to the tolerances for a given IC production process, some IC's turn out to be "fast", and others "slow", as compared to IC's produced by an average or nominal process. That is, a given production run may produce devices that switch signals more quickly than average, being referred to as a "fast" process, and vice-versa for a "slow" process. Hence, an output buffer design that satisfies the speed requirements may violate the noise requirements, and vice-versa.

It is desirable to have an integrated circuit that generates low noise while having the ability to communicate at a sufficiently high data rate over conductors presenting a significant capacitive load.

SUMMARY OF THE INVENTION

I have invented an integrated circuit technique whereby the rise time, or the fall time, or both, of logic signals are controlled by applying a control voltage to at least one control transistor in an output buffer. The control signal is generated by a circuit responsive to factors, typically including the process speed, that affect the rise and/or fall times of signals generated by the output buffer. In a typical CMOS embodiment, the control voltage is derived from a transistorresistor voltage divider on the integrated circuit, and the control transistors are in series with the channel current paths of input transistors connected to the gates of complementary output transistors.

DETAILED DESCRIPTION

Figure 1:
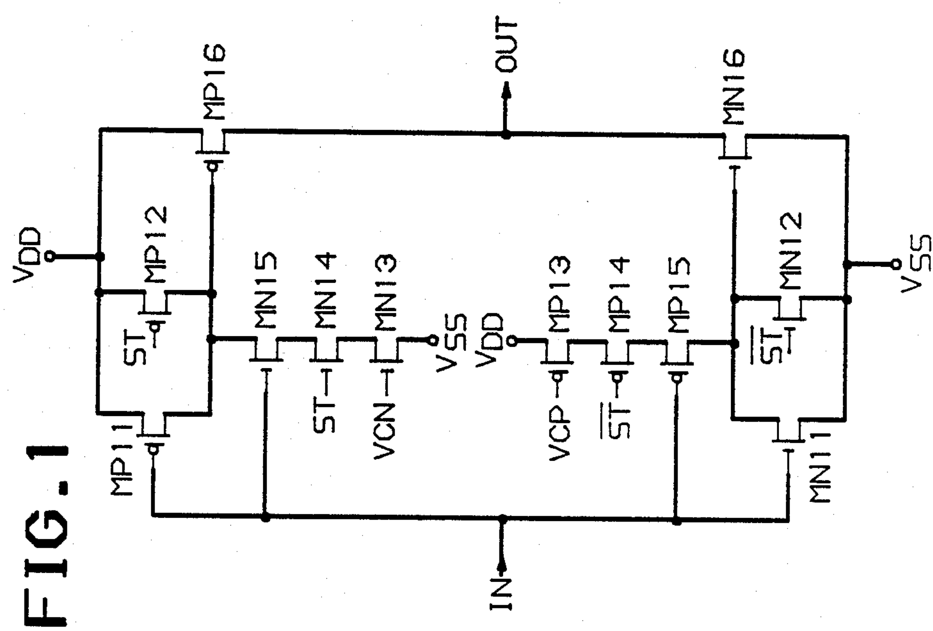
FIG. 1 shows an embodiment of a complementary (e.g. CMOS) output buffer utilizing the inventive technique.

The following detailed description relates to a technique for reducing the noise generated by the output buffers of an integrated circuit. Referring to FIG. 1, an implementation of the present technique for a complementary (e.g., CMOS) output buffer is shown. The present invention provides for the inclusion of at least one of control transistors MN13 and MP13 in an otherwise conventional output buffer having output transistors MP16 and MN16 driven by input transistors MP11, MN15, MN11, MP15, respectively.

A first control signal VCN is applied to the gate of control transistor MN13, and a second control signal VCP is applied to the gate of control transistor MP13. VCN is generated by a circuit that causes VCN to increase (i.e., become more positive) when the integrated circuit is fabricated by a "slow" process. This increase of VCN increases the conductance of MN13, allowing the channel current through MN13 to increase, so that the gate voltage of p-channel output transistor MP16 is pulled down more quickly to a low state by input transistor MN15 when the input signal (IN) goes high. Hence, the channel current through MP16 is increased by the action of VCN on MN13, and the rise time of the output voltage (OUT) is reduced. VCP is generated by a circuit that causes VCP to decrease (i.e., become more negative) when the integrated circuit is fabricated by a "slow" process. This decrease of VCP increases the conductance of MP13, allowing the channel current through MP13 to increase, so that the gate voltage of n-channel output transistor MN16 is pulled up more quickly to a high state by input transistor MP15 when the input signal (IN) goes low. Hence, the fall time of the output voltage is reduced. Therefore, the effects of the "slow" process on the rise and fall times are largely negated by the effects of the control voltages VCN and VCP on the control transistors MN13 and MP13. In the case of a "fast" process, the control voltages change in the direction that decreases the conductance of the control transistors, thereby tending to increase the rise and fall times so as to negate the effects of process change. Therefore, the rise and fall times of the output buffer are held approximately constant with respect to processing variations. By generating the control voltages in a suitable manner, the effects of temperature and power supply voltage variations on the rise and fall times may also be largely negated.

Figure 2:
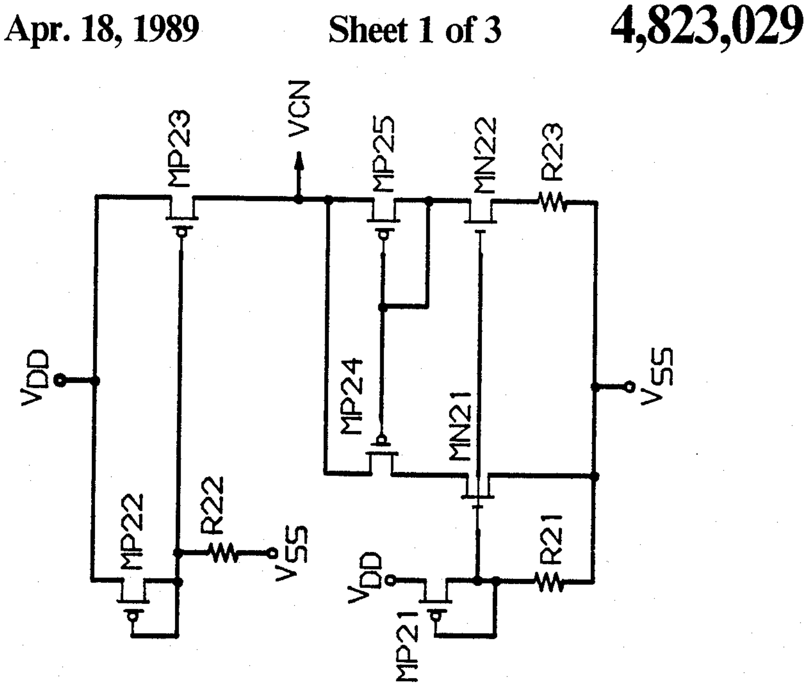
FIGS. 2 and 3 show a first embodiment of the circuitry for generating control voltages for the n and p channel control transistors of FIG. 1, respectively.
Figure 3:
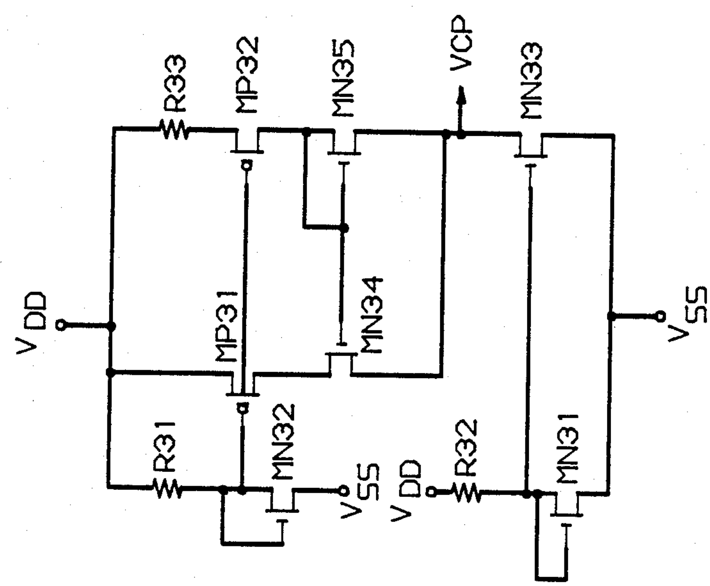

Referring to FIG. 2, a control circuit suitable for generating VCN is illustrated. Transistors MP21 and MP22 are relatively small, thereby providing channel resistances large compared to R21 and R22, respectively, which typically have values in the range of 5 to 7 kilohms in one present implementation. Therefore, the currents through R21 and R22, and hence the voltages on the gates of MN22 and MP23, are largely determined by MP21 and MP22, respectively. In the case of a "slow" process, the current through the channels of MP21 and MP22 are relatively small, so that the voltage at the gates of MN21, MN22 and MP23 are relatively low. Hence, MN22 tends to turn off, and MP23 tends to turn on, thereby raising the voltage VCN. A reduction in power supply voltage also acts to raise VCN. Conversely, in the case of a "fast" process, the channel currents through MP21 and MP22 are relatively large, so that the gate voltages on MN22 and MP23 rise. Hence MN22 tends to turn on and MP23 tends to turn off, thereby reducing the voltage VCN. An increase in the power supply voltage also acts to raise VCN. The current mirror comprising MN21, MP24 and MP25 is included in this embodiment to increase the gain of the circuit. A comparable circuit for generating VCP is illustrated in FIG. 3, and operates in an analogous manner as discussed above for the circuit of FIG. 2. Note that two transistor-resistor voltage dividers (MP21–R21 and MP22–R22) are shwon in FIG. 2, in order to provide increased design freedom to cover expected processing variations. However, in some case only a single divider is necessary to generate a control voltage. Also, the presently preferred design connects the gate of each divider transistor (MP21 and MP22) to its drain, thereby ensuring conduction, but other configurations are possible.

Figure 4:
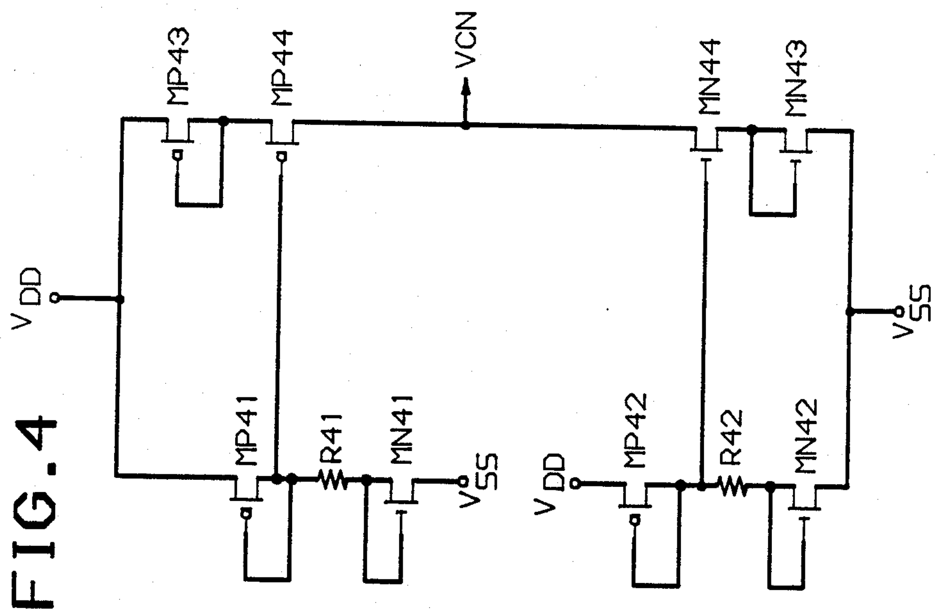
FIGS. 4 and 5 shows a second embodiment of the circuitry for generating control voltages for the n and p channel control transistors of FIG. 1, respectively.
Figure 5:
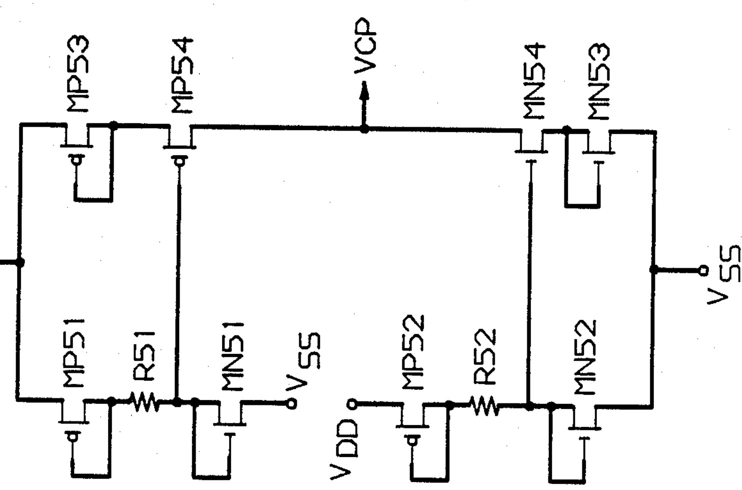

Referring to FIG. 4, a presently preferred embodiment of a circuit to generate VCN is illustrated. Process and power supply voltage dependent voltages are generated by MP1–R1 and MP2–R2 in an analogous manner as before. Additionally, optional transistors MN41 and MN42 are shown in the channel current paths of MP41 and MP42, in order to compensate for possible variations in the gains of the p channel and n channel transistors due to processing variations. In many cases these processing variations, due primarily to the difference in channel doping between the two transistor types, are sufficiently small than the lower end of resistors R41 and R42 may be connected to ground, as before. An increase in the channel current through MP41, as due to a "fast" process or an increase in power supply voltage, causes the voltage on the gate of MP44 to increase, thereby tending to turn MP44 off. An increase in the channel current through MP41 causes the voltage on the gate of MN44 to increase, thereby tending to turn MN44 on. Hence, VCN is pulled closer to ground (0 volts) if the process is "fast" or the power supply voltage high. In addition, transistor MN43 is included in the source path of MN44 and connected to provide a threshold voltage drop between the source of MN44 and ground. This prevents VCN from going to 0 volts (ground), as could otherwise occur with the combination of fast processing and high power supply voltages. It is undesirable for VCN to come closer than this to 0 volts, as that would cause transistor MN13 in FIG. 1 to turn off, thereby increasing the rise time an undesirable amount. The transistor MP43 is also included in the circuit of FIG. 4, in order to balance the temperture variations of MN43 in that figure. Note that the current mirror of FIG. 2 is omitted in the embodiment of FIG. 4, with the required gain being obtained by increasing the sizes of MP44 and MN44 a suitable amount. A comparable circuit for generating VCP is shown in FIG. 5.

Figure 6:
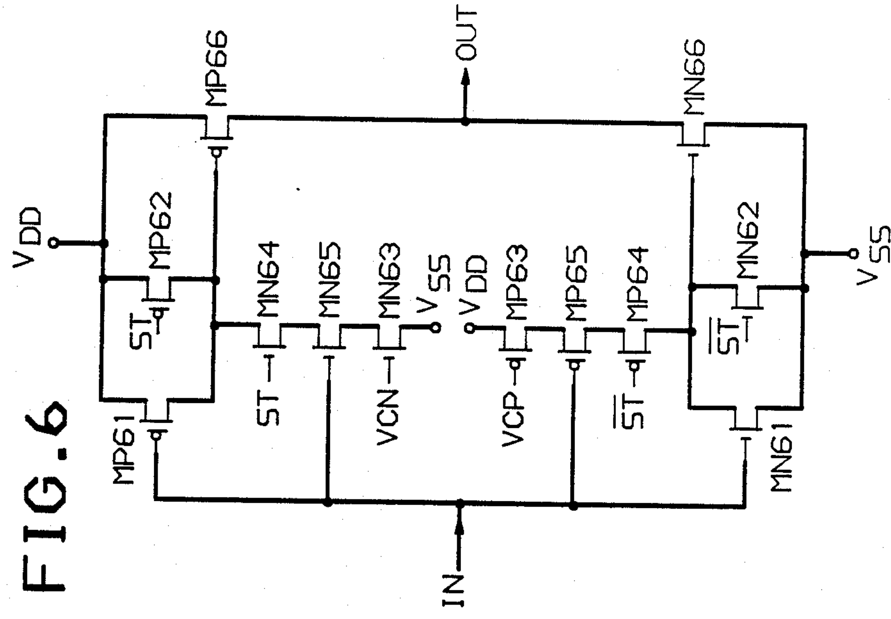
FIG. 6 shows an alternate embodiment of an output buffer utilizing the inventive technique.

Note that the circuit of FIG. 1 includes optional transistors MP12, MN14, MN12 and MP14 for placing the output in a high impedance (i.e., tri-state) condition in a manner well known in the art. That is, when voltage ST is at a high level, and voltage $\overline{ST}$ is at a low level, transistors MN14 and MP14 are turned on (conducting), while transistors MP12 and MN12 are turned off (nonconducting), thereby allowing normal operation of the output buffer. However, when ST is low and $\overline{ST}$ is high, then the gate MP16 is pulled to a high voltage level by MP12 and the gate of MN16 is pulled to a low level by MN12. Hence, both MP16 and MN16 are turned off, placing the output in the tri-state condition. This conventional technique allows the output buffers of several integrated circuits to be connected to the same output line conductor, with typically only one of the IC outputs being active at a given time, and the others being placed in the tri-state condition to avoid current contentions on the output line. Note that as shown, the control transistor MN13 is connected between the tri-state transistors MN14 and ground, and the control transistor MP13 is connected between the tri-state transistor MP14 and the positive power supply voltage. This arrangement is desirable for placing the capacitance of MN13 and MP13 as far as possible from the gates of MP16 and MN16, since the sizes, and hence capacitance, of control transistors MN13 and MP13 are relatively large as compared to tri-state transistors MN14 and MP14. Therefore, the circuit speed is optimized for the case wherein the IN signal arrives after the ST signal. However, in the case wherein ST arrives after IN, it is optimum to place the tri-state transistors MN14, MP14 between the drains of input transistors MN15, MP15 and the gates of MP16, MN16 respectively. (Hence, the sources of MN15 and MP15 then connect directly to the drains of MN13 and MP13 respectively.) This embodiment is illustrated in FIG. 6.

EXAMPLE

The foregoing principles will be more fully illustrated by means of the following Example. The output buffer of FIG. 1 and the control voltage circuits of FIGS. 2 and 3 are constructed in a twin-tub 1.25 micrometer CMOS technology. The resistors were all formed in the n-tub; the value of R21 and R22 are 5 kilohms, R23 was 625 ohms, R31 and R32 were 7 kilohms, and R33 was 780 ohms. The n-channel transistors had channel lengths of about 1.25 micrometer, and the p-channel transistors had channel lengths of about 1.75 micrometers, except for the control transistors MN13, MP14, which had channel lengths of about 3 micrometers. The channel widths of MN14 and MN15 were about 55 micrometers, and the channel width of MP14 and MP15 were about 110 micrometers. The channel widths of control transistors MN13 and MP13 are somewhat larger, being about 138 micrometers and 275 micrometers, respectively. The channel widths of MP16 and MN16 were about 800 micrometers, being mainly determined by the size of the capacitive load being driven. The channel widths of MP21, MP22, MP23, MP24 and MP25 were 3.25, 14.25, 55.5, 550.5, and 6 micrometers, respectively, whereas the channel widths of MN21, and MN22 were 69.25 and 33.5 micrometers, respectively. The channel widths of MP31 and MP32 are 220.5 and 55.5 micrometers, respectively whereas the channel widths of MN31, MN32, MN33, MN34 and MN35 were 3.25, 3.25, 55.5, 220.5, and 3.25 micrometers respectively. According to computer simulations, the forgoing design yielded the following: The control voltage VCN ranges from about 10 millivolts below the positive power supply voltage ($V_{DD}$) for a "slow" process, to about 1.6 volts above ground ($V_{SS}$) for a "fast" process. A comparable range was obtained for VCP. This design held the rise time to about 7 nanoseconds over the range of fast to slow processes when driving a 130 picofarad load. This compares to comparable output buffer without the inventive control technique, whose rise times ranged from 5 to 10 nanoseconds over the range of process variations from fast to slow. The fall time of the buffer using the inventive technique ranged from 5 nanoseconds for a fast process to 4 nanoseconds for a slow process, showing a small degree of overcompensation due to the control circuitry. This compared to fall times that ranged from 3 to 7 nanoseconds for fast and slow processes when the buffer was implemented without the inventive control technique. As expected, the noise generated by the output buffer using the present technique measured approximately constant over the range of process conditions using the inventive technique, whereas the noise increased significantly (approximately an order of magnitude) for fast processing of the buffer without the inventive technique. A significant improvement in noise was also obtained by the inventive control circuitry for changes in power supply voltages in the range of 4.75 to 5.25 volts.

When implementing the control circuitry of FIGS. 4 and 5, not only is an improvement obtained with respect to processing and power supply voltage variations, but also with respect to temperature variations over the range of 0 to 105 degrees C.

Although the output buffers employing the present technique are typically used to drive conductors external to an integrated circuit "chip", other uses are possible. For example, in the case of wafer scale integration, the output buffers may be used to drive conductors connecting widely separated circuit portions on the same wafer. In these and other cases, the present technique is useful when the conductors being driven present a significantly greater load capacitance than do intra-circuit conductors, so that the current drive capability is a significant factor in the design of the buffers. While the foregoing has illustrated the inventive technique for controlling both the rise and fall times, this need not be the case in all implementations of the inventive technique. For example, in driving transistor-transistor logic (TTL) loads, the rise time tends to be longer, thereby generating less noise than the fall time. Hence, the present technique may be beneficially used even if only the fall time is controlled. In another application, if an open drain output stage is used as the output buffer, only a single conductivity type output transistor (e.g., n-type) is used. The output transistor then pulls down the load, with an external resistor provided for pulling up the load. In that case, only a single control transistor (e.g., a p-channel in the case of an n-channel output transistor) is needed, and hence only a single control voltage (e.g., VCP) is required.

What is claimed is:

1. An integrated circuit comprising at least one output buffer having an input (IN) for receiving a logical signal and an output (OUT) for driving a conductor with said signal, wherein said buffer comprises at least one input transistor having its gate coupled to said input, and further comprises at least one output transistor having its gate coupled to the drain of said input transistor, and a controlled electrode coupled to said output, characterized in that said output buffer further comprises a control transistor included in the source path of said at least one input transistor, wherein said integrated circuit further comprises means for generating a control voltage applied to the gate of said control transistor, with said control voltage decreasing the conductance of said control transistor when said integrated circuit is fabricated by a process that yields transistor switching speeds faster than a nominal process, wherein said control voltage is derived from the node connecting the drain of a first voltage divider transistor and a resistor coupled to a power supply voltage conductor, and wherein said first voltage divider transistor has its gate connected to its drain.

2. The integrated circuit of claim 1 comprising both p-channel and n-channel output transistors having their sources connected to said output.

3. The integrated circuit of claim 2 comprising both p-channel and n-channel input transistors having their gates coupled to said input, wherein a control transistor is included in the source paths of both of said input transistors, whereby control of both the rise time and the fall time of said signal at said output is obtained.

4. The integrated circuit of claim 1 wherein a tri-state transistor is connected between the source of said input transistor and the drain of said control transistor.

5. The integrated circuit of claim 1 wherein a tri-state transistors is connected between the gate of said output transistor and the drain of said input transistor, with said control transistor being connected between the source of said input transistor and a power supply voltage conductor.

6. The integrated circuit of claim 1 wherein said control voltage is further derived from the node connecting the drain of a second voltage divider transistor and a resistor coupled to a power supply voltage conductor, wherein said second voltage divider transistor has its gate connected to its drain.

* * * * *